(12) United States Patent
Blanco, Jr. et al.

(10) Patent No.: US 7,701,716 B2
(45) Date of Patent: Apr. 20, 2010

(54) HEAT-TRANSFER MECHANISM INCLUDING A LIQUID-METAL THERMAL COUPLING

(75) Inventors: Richard Lidio Blanco, Jr., Santa Clara, CA (US); Douglas L. Heirich, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 12/141,295

(22) Filed: Jun. 18, 2008

(65) Prior Publication Data

US 2009/0316359 A1 Dec. 24, 2009

(51) Int. Cl.
*H05K 7/20* (2006.01)
*F16D 15/00* (2006.01)
*F16L 27/00* (2006.01)

(52) U.S. Cl. ............. 361/699; 361/679.52; 361/679.53; 361/679.54; 361/704; 165/86; 165/104.14; 165/104.19; 165/104.26; 285/145.2; 285/145.5; 285/226; 285/272

(58) Field of Classification Search ......... 361/699–700, 361/704; 165/80.4–80.5, 104.33, 185; 285/41, 285/145.1–145.2, 145.4–145.5, 147.1, 184, 285/187, 224, 226, 272, 278, 381.1; 439/5, 439/10, 32–33, 179; 174/15.2, 86, 104.14, 174/104.19, 104.26

See application file for complete search history.

(56) References Cited

U.S. PATENT DOCUMENTS

| | | | | |
|---|---|---|---|---|
| 4,345,642 A | * | 8/1982 | Ernst et al. | 165/86 |
| 4,688,147 A | * | 8/1987 | Ono | 361/699 |
| 5,588,483 A | * | 12/1996 | Ishida | 165/86 |
| 5,647,429 A | * | 7/1997 | Oktay et al. | 165/104.26 |
| 5,847,925 A | * | 12/1998 | Progl et al. | 361/679.47 |
| 6,253,836 B1 | * | 7/2001 | Mitchell | 165/86 |
| 6,341,062 B1 | * | 1/2002 | Patel | 361/679.54 |
| 7,518,861 B2 | * | 4/2009 | Lev et al. | 165/104.33 |
| 7,551,443 B2 | * | 6/2009 | Liu et al. | 361/700 |
| 2006/0086482 A1 | * | 4/2006 | Thayer et al. | 165/104.26 |
| 2008/0253082 A1 | * | 10/2008 | Lev et al. | 361/687 |

OTHER PUBLICATIONS

ITworld.com, "Hitachi releases water-cooled notebook PC", Kuriko Miyako, IDG News Service, Tokyo Bureau, file:///Users/dgrundler/Library/Mail9620Downloads/ITworld.com%20-%20Hitachi9620releases%20water-cooled%20notebook%20PC.webarchive, downloaded Jul. 10, 2008, portions are not readable.

* cited by examiner

*Primary Examiner*—Jayprakash N Gandhi
*Assistant Examiner*—Robert J Hoffberg
(74) *Attorney, Agent, or Firm*—Park, Vaughan & Fleming LLP

(57) ABSTRACT

Embodiments of a heat-transfer mechanism are described. This heat-transfer mechanism includes a first heatpipe having a first end and a second end, and a second heatpipe having a third end and a fourth end. Moreover, a heatpipe coupler is thermally coupled to the second end of the first heatpipe and the third end of the second heatpipe. This heatpipe coupler includes a housing surrounding a cavity and a liquid metal contained within the cavity, thereby providing a thermal path from the first end of the first heatpipe, which is configured to couple to a condenser, to the fourth end of the second heatpipe, which is configured to couple to an evaporator.

19 Claims, 7 Drawing Sheets

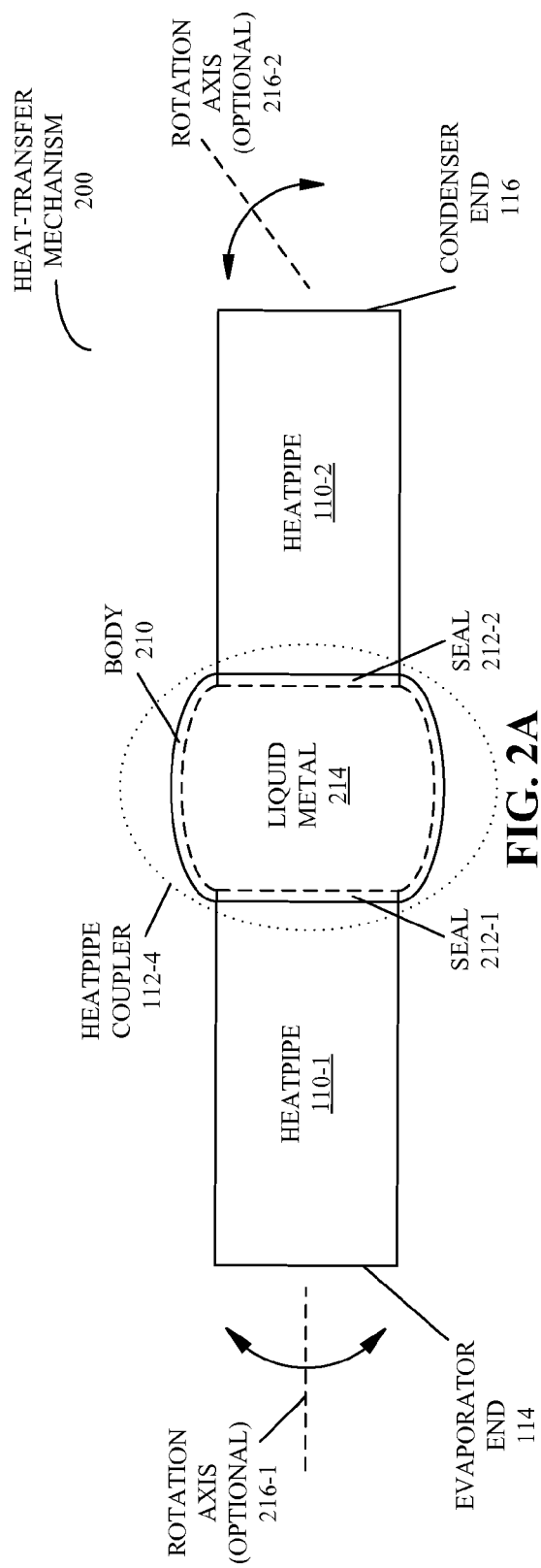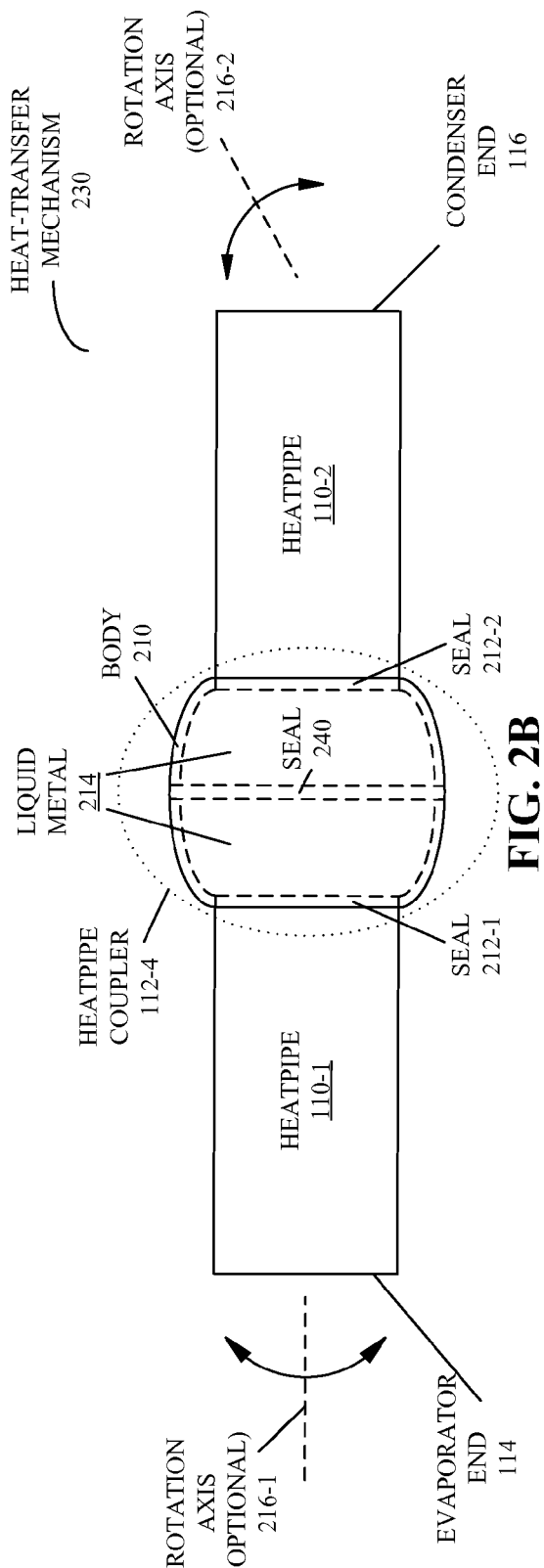

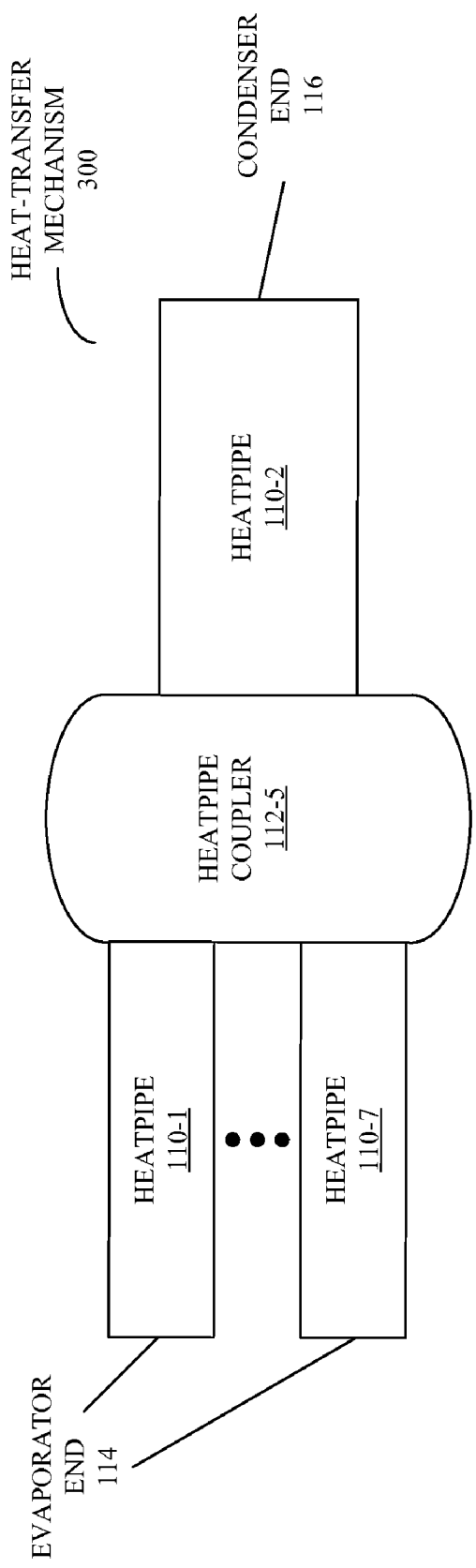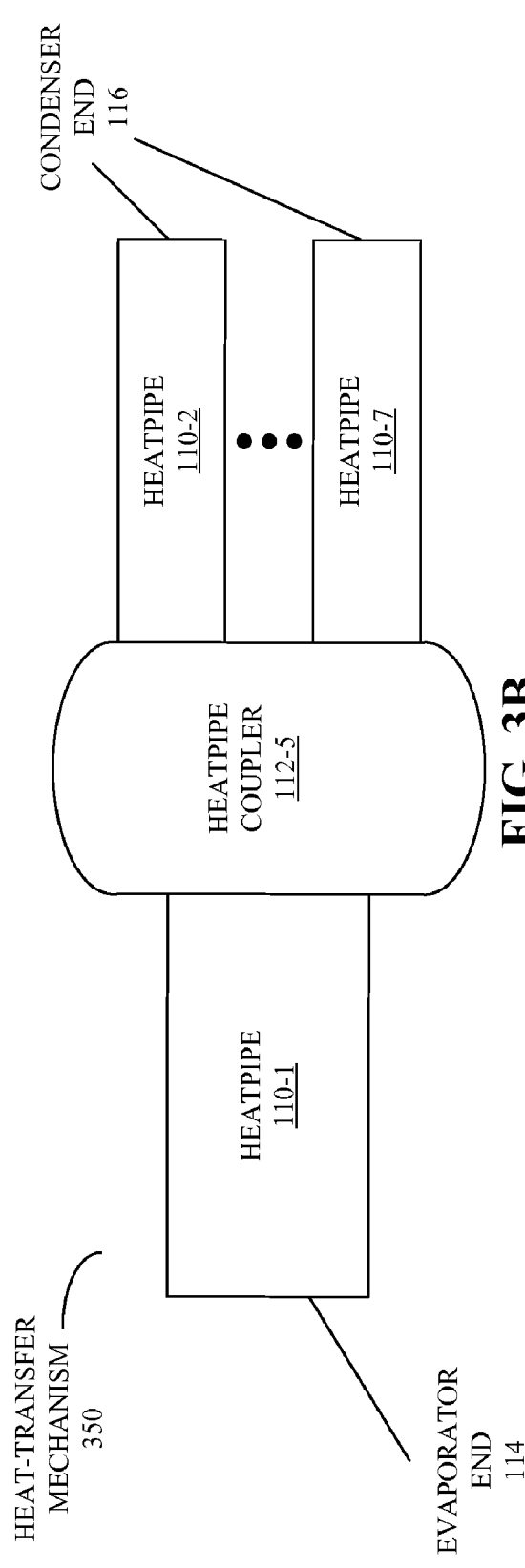

```
                                    ┌─ 500
┌─────────────────────────────────────────────────────────────┐
│  TRANSPORT HEAT FROM AN EVAPORATOR AT A FIRST END OF A FIRST │
│      HEATPIPE TO A SECOND END OF THE FIRST HEATPIPE          │
│                          510                                  │
└─────────────────────────────────────────────────────────────┘
                              │
                              ▼
┌─────────────────────────────────────────────────────────────┐
│   THERMALLY COUPLE THE HEAT FROM THE SECOND END OF THE FIRST │
│  HEATPIPE TO A THIRD END OF A SECOND HEATPIPE VIA A HEATPIPE COUPLER │
│              WHICH INCLUDES A LIQUID METAL                    │
│                          512                                  │
└─────────────────────────────────────────────────────────────┘
                              │
                              ▼
┌─────────────────────────────────────────────────────────────┐
│  TRANSPORT THE HEAT FROM THE THIRD END OF THE SECOND HEATPIPE TO A │
│    CONDENSER AT A FOURTH END OF THE SECOND HEATPIPE          │
│                          514                                  │
└─────────────────────────────────────────────────────────────┘
```

FIG. 5

HEAT-TRANSFER MECHANISM INCLUDING A LIQUID-METAL THERMAL COUPLING

BACKGROUND

1. Field of the Invention

The present invention relates to heat-transfer techniques. More specifically, the present invention relates to a heat-transfer mechanism that includes a liquid-metal thermal coupling.

2. Related Art

The computational performance of electronic devices has increased significantly in recent years. This has caused an increase in power consumption and associated heat generation. It has consequently become a considerable challenge to manage this 'thermal load' to maintain acceptable internal and external operating temperatures.

Portable electronic devices, such as laptop computers (notebook PCs), cellular telephones, and personal digital assistants, pose additional design constraints which make it harder to manage thermal load. In particular, size and weight limitations in such devices can make it difficult to achieve desired operating temperatures. For example, some laptop computers utilize heat-transfer mechanisms that include a heatpipe which transports heat from a heat source, such as a processor chip, to a condenser. Heatpipes are efficient at transporting heat, but because of fluidic and thermodynamic losses, the total length of the heatpipes in laptop computers is effectively constrained to be about 150 mm. Moreover, heatpipes typically do not offer mechanical flexibility. Unfortunately, these constraints pose problems in the design and layout of heat-transfer mechanisms in such systems.

Hence, what is needed are heat-transfer mechanisms that overcome the problems listed above.

SUMMARY

One embodiment of the present invention provides a heat-transfer mechanism that includes a first heatpipe having a first end and a second end, and a second heatpipe having a third end and a fourth end. Moreover, a heatpipe coupler is thermally coupled to the second end of the first heatpipe and the third end of the second heatpipe. This heatpipe coupler includes a housing surrounding a cavity and a liquid metal contained within the cavity, thereby providing a thermal path from the first end of the first heatpipe, which is configured to couple to a condenser, to the fourth end of the second heatpipe, which is configured to couple to an evaporator.

In some embodiments, a given heatpipe, which can be the first heatpipe or the second heatpipe, has a cross-sectional diameter less than 8 mm, and an end-to-end or total length of the heat-transfer mechanism is greater than 225 mm.

In some embodiments, the heat-transfer mechanism includes an additional heat-transfer mechanism, which includes two heatpipes thermally coupled, end-to-end, by another heatpipe coupler, that is thermally coupled, in series, to the heat-transfer mechanism. Moreover, the additional heat-transfer mechanism may be thermally coupled to the heat-transfer mechanism by an additional heatpipe coupler.

In some embodiments, the housing includes a body and end seals, where a given end seal is coupled to either the first heatpipe or the second heatpipe. A given end seal may be configured to allow rotation of the first heatpipe and/or the second heatpipe with respect to the heatpipe coupler. Moreover, the first heatpipe may have a different axis of rotation than that of the second heatpipe. Alternatively, the end seals may be rigidly coupled to the first heatpipe and/or the second heatpipe.

In some embodiments, the housing includes an additional seal which divides the cavity into two compartments that each include a portion of the liquid metal. This additional seal may be configured to allow rotation of the two compartments of the housing with respect to each other. Moreover, axes of rotation of the two compartments may be different.

In some embodiments, the first heatpipe and/or the second heatpipe include one or more bends.

In some embodiments, a direction of a symmetry axis of the first heatpipe is different than that of the second heatpipe.

In some embodiments, the heat-transfer mechanism includes multiple heatpipes coupled to the heatpipe coupler which are each configured to couple to the condenser. Moreover, in some embodiments the heat-transfer mechanism includes multiple heatpipes coupled to the heatpipe coupler which are each configured to couple to additional evaporators.

In some embodiments, the heatpipe coupler is configured to allow linear motion of the first heatpipe and/or the second heatpipe with respect to the remainder of the heat-transfer mechanism.

In some embodiments, the housing includes a metal or plastic. For example, the metal may include gold, nickel, or titanium. Moreover, the liquid metal may include a metal alloy, such as gallium-indium-tin.

Another embodiment provides a method for transporting heat from an evaporator to a condenser. During the method, heat is transported from the evaporator at the first end of the first heatpipe to the second end of the first heatpipe. Next, the heat is thermally coupled from the second end of the first heatpipe to the third end of the second heatpipe via the heatpipe coupler which includes the liquid metal. Then, the heat is transported from the third end of the second heatpipe to the condenser at the fourth end of the second heatpipe.

Another embodiment provides a portable electronic device that includes an integrated circuit and the condenser, where the first end of the first heatpipe is thermally coupled to the condenser and the fourth end of the second heatpipe is thermally coupled to the integrated circuit, thereby providing a thermal path from the condenser to the integrated circuit.

BRIEF DESCRIPTION OF THE FIGURES

FIG. 2A is a block diagram illustrating a heat-transfer mechanism in accordance with an embodiment of the present invention.

FIG. 2B is a block diagram illustrating a heat-transfer mechanism in accordance with an embodiment of the present invention.

FIG. 3A is a block diagram illustrating a heat-transfer mechanism in accordance with an embodiment of the present invention.

FIG. 3B is a block diagram illustrating a heat-transfer mechanism in accordance with an embodiment of the present invention.

FIG. 5 is a flowchart illustrating a process for transporting heat from an evaporator to a condenser in accordance with an embodiment of the present invention.

Note that like reference numerals refer to corresponding parts throughout the drawings. Moreover, multiple instances of the same type of part are designated by a common prefix separated from an instance number by a dash.

DETAILED DESCRIPTION

Figure 1A:
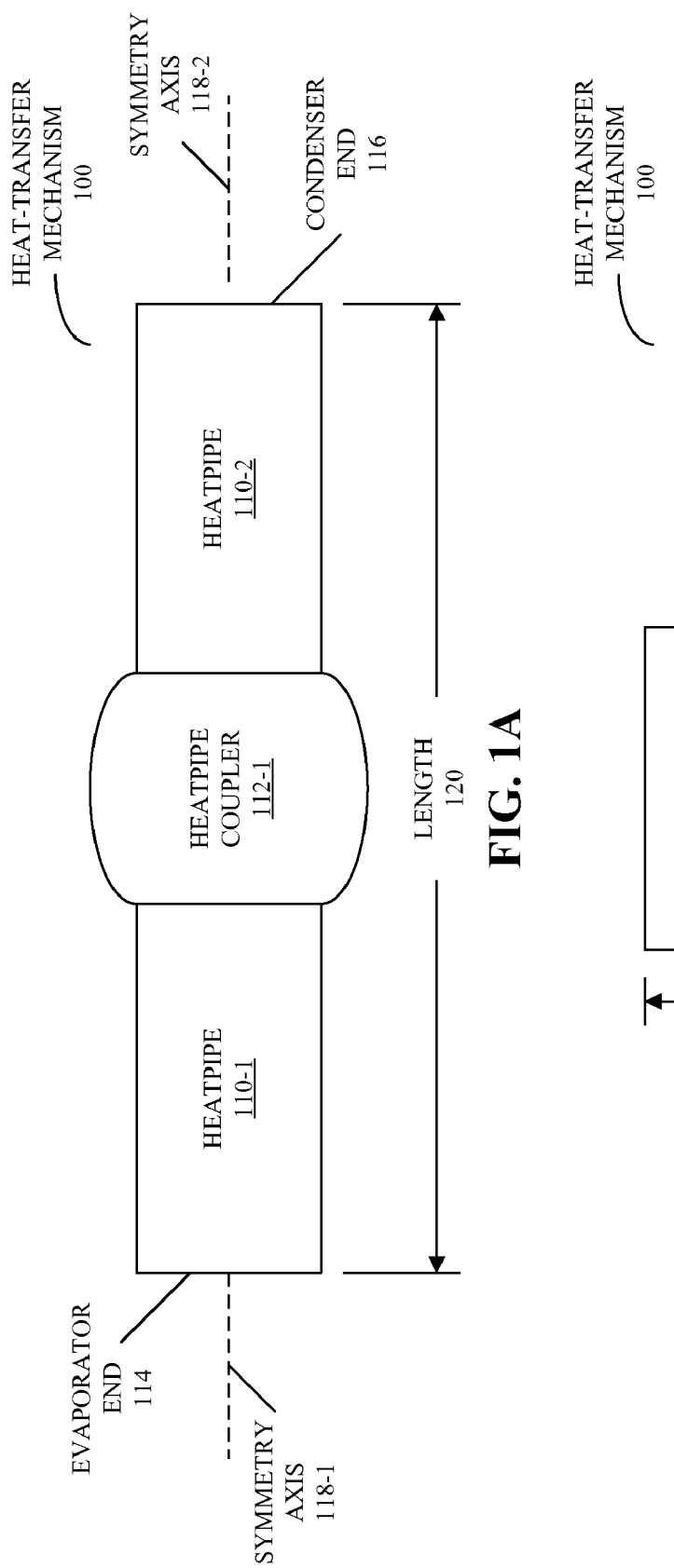
FIG. 1A is a block diagram illustrating a heat-transfer mechanism in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a heat-transfer mechanism, a computer system and/or a portable electronic device that includes the heat-transfer mechanism, and a method for transporting heat from an evaporator to a condenser are described. This heat-transfer mechanism may include one or more instances of two heatpipes that are thermally coupled, end-to-end, by a heatpipe coupler, which includes a liquid metal, such as gallium-indium-tin, and which provides a thermal path from a condenser end of the heat-transfer mechanism to an evaporator end of the heat-transfer mechanism (e.g., one that is thermally coupled to a heat source). Because the liquid metal may be corrosive and/or reactive with water or oxygen, the heatpipe coupler may include a housing that includes a metal or plastic, which surrounds a cavity that contains the liquid metal.

Moreover, the heat-transfer mechanism may be configured to allow the heatpipes to be rotated and/or move linearly with respect to the heatpipe coupler. Additionally, the heat-transfer mechanism may include fan-in (in which multiple heatpipes are coupled between one or more evaporators and the heatpipe coupler) and/or fan-out (in which multiple heatpipes are coupled between one or more condensers and the heatpipe coupler).

By including liquid metal in the heat-transfer mechanism, a total length of heat-transfer mechanism (for a given heatpipe cross-sectional area) can be increased. Furthermore, the heat-transfer mechanism may be flexible and/or may have additional mechanical degrees of freedom. These properties may enhance the performance of the heat-transfer mechanism in a variety of applications, including those in portable electronic devices. In particular, relative to comparable-size heat-transfer mechanisms that do not include liquid metal, the heat-transfer mechanism may provide: a lower thermal resistance, a lower temperature gradient from the evaporator to the condenser, increased heat-carrying capacity, and/or increased reliability (for example, the heat-transfer mechanism may provide high performance over multiple mechanical cycles).

Note that the computer system and/or the portable electronic device may include: a server, a laptop computer, a personal computer, a work station, a mainframe computer, a digital signal processor, a portable-computing device, a personal organizer, a cellular telephone, a personal digital assistant, a game console, an MP3 player, a device controller, and/or a computational engine within an appliance.

We now describe embodiments of the heat-transfer mechanism. FIG. 1A presents a block diagram illustrating a side view of heat-transfer mechanism 100 that includes heatpipes 110 thermally coupled, end-to-end, by heatpipe coupler 112-1. As described further below with reference to FIG. 2A, this heatpipe coupler includes a housing surrounding a cavity, which contains a liquid metal. In this way, a thermal path is provided from an evaporator end 114 of the heat-transfer mechanism 100 (which can be thermally coupled to a heat source, such as one or more integrated circuits in a portable electronic device) to a condenser end 116 of the heat-transfer mechanism 100 (which can be thermally coupled to a condenser).

Heatpipes 110 can be very efficient, passive heat pumps or diffusers. In particular, a thermal gradient across one of the heatpipes 110, such as heatpipe 110-1, may be less than 2 C. In some embodiments, the heatpipes 110 each have a solid copper jacket with a hollow interior. An inner surface of the jacket may be coated with a thin wick structure that includes copper powder to increase an effective contact area. In addition, the hollow interior may hold a soft vacuum, i.e., may have reduced air pressure. This reduced pressure may allow water to boil more easily during operation of a device, such as a portable electronic device, that includes the heat-transfer mechanism 100. The resulting water vapor may be very effective in carrying heat from the heat source at the evaporator end 114 to the condenser end 116. As a consequence, the hollow interiors of the heatpipes 110 may have an effective thermal conductivity of 5000 W/m/C, which is 100 times larger than that of solid copper.

Note that the heatpipes 110 in heat-transfer mechanism 100 may be arranged in a wide variety of configurations. For example, symmetry axes 118 of the heatpipes 110 may be coaxial (or not). Moreover, as illustrated in FIG. 1C, which presents a block diagram illustrating a heat-transfer mechanism 130, either or both of the heatpipes 110 may include bends 140.

Figure 1B:
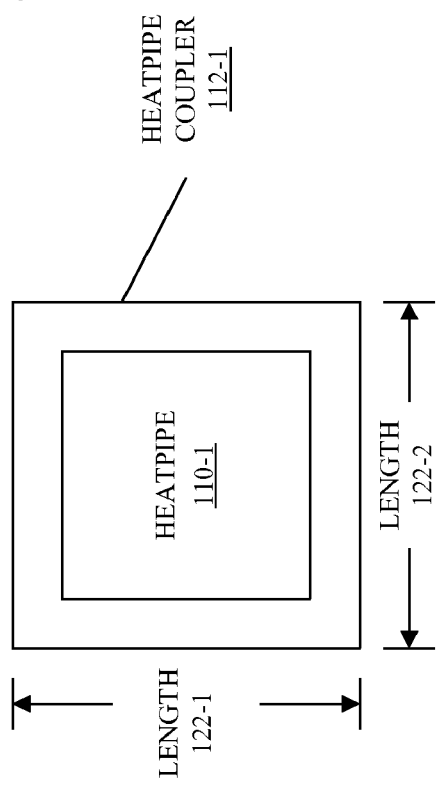
FIG. 1B is a block diagram illustrating a heat-transfer mechanism in accordance with an embodiment of the present invention.
Figure 1C:
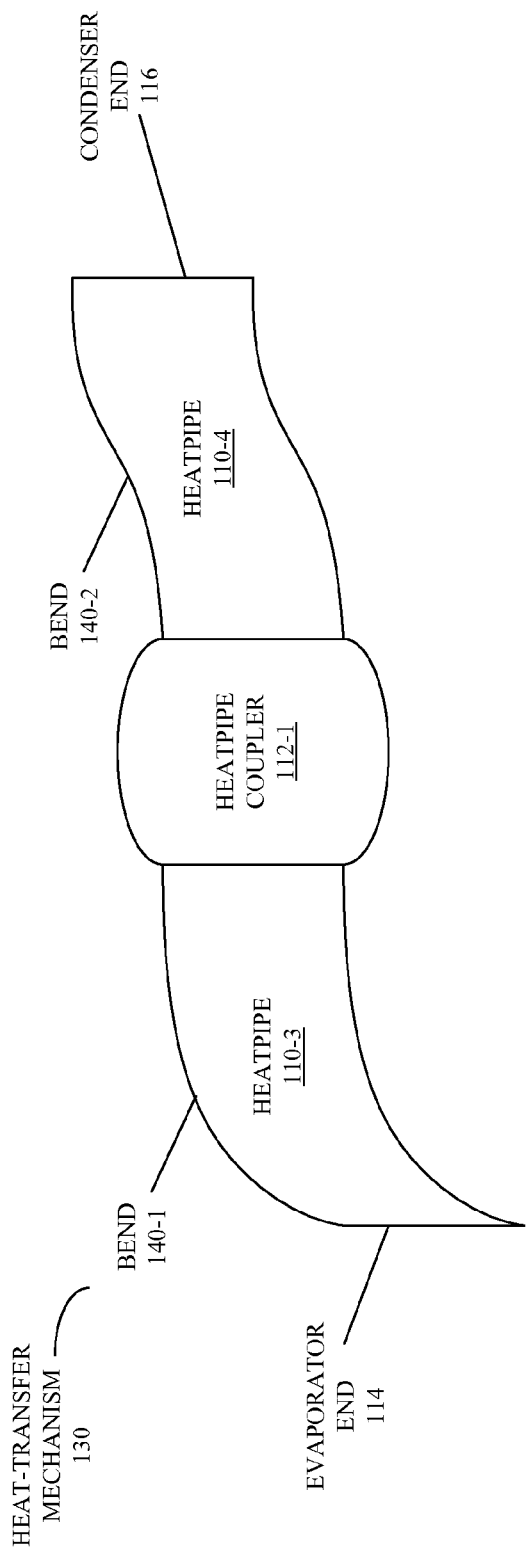
FIG. 1C is a block diagram illustrating a heat-transfer mechanism in accordance with an embodiment of the present invention.

FIG. 1B presents a block diagram illustrating an end view of the heat-transfer mechanism 100. In many applications, such as portable electronic devices, size and weight limitations may constrain the cross-sectional area of the heat-transfer mechanism 100. For example, lengths 122 (or the cross-sectional diameters of heat-transfer mechanism 100) may each be 8 mm. Moreover, for a cross-sectional area corresponding to lengths 122, the longitudinal length of a given heatpipe, such as heatpipe 110-1, may be limited by fluidic and thermodynamic losses to less than approximately 225 mm. However, by including a heatpipe coupler that includes a liquid metal (such as heatpipe coupler 112-1), length 120 (FIG. 1) of the heat-transfer mechanism 100 (i.e., the longitudinal length) may be greater than this threshold. As described below with reference to FIG. 4, this feature may be used to facilitate heat transfer in a variety of applications including portable electronic devices.

Figure 1D:
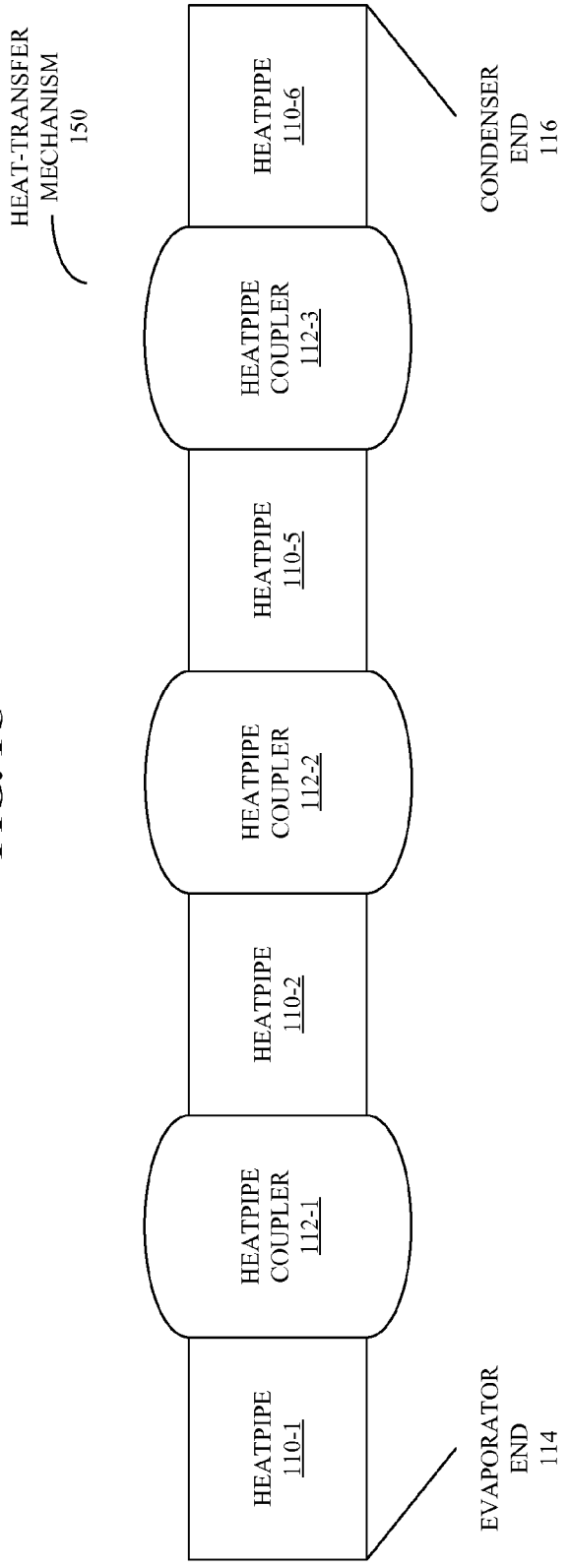
FIG. 1D is a block diagram illustrating a heat-transfer mechanism in accordance with an embodiment of the present invention.

Additionally, the total or longitudinal length of the heat-transfer mechanism may be increased by thermally coupling, end to end, additional instances of the heatpipes and the heatpipe coupler. This is illustrated in FIG. 1D, which presents a block diagram illustrating a heat-transfer mechanism 150. In particular, heat-transfer mechanism 150 includes heatpipe coupler 112-3 and heatpipes 110-5 and 110-6, which are coupled to heatpipe coupler 112-1 and heatpipes 110-1 and 110-2 by heatpipe coupler 112-2.

In addition to increasing the longitudinal length, the heat-transfer mechanism may also provide mechanical flexibility, by enabling mechanical rotation or linear motion of the heatpipes relative to the heatpipe coupler. (As described below with reference to FIG. 4, this additional mechanical degree of freedom can also be used to facilitate heat transfer in a variety of applications including portable electronic devices.) This additional flexibility motivates the use of the liquid metal in the heatpipe coupler (as opposed to using a thermally conductive solder to mechanically and thermally couple the heatpipes). However, liquid metals are often corrosive, and react with oxygen and/or water, which pose problems in the design of the heatpipe coupler.

FIG. 2A presents a block diagram illustrating a heat-transfer mechanism 200 that includes a heatpipe coupler 112-4 which addresses these problems. In particular, an outer housing of the heatpipe coupler 112-4 includes a body 210 and end seals 212, which are respectively thermally coupled to a given one of the heatpipes 110. In some embodiments, the housing includes a metal or plastic. For example, the metal may include gold, nickel, titanium, and/or an alloy of two or more of these chemicals. Moreover, the plastic may be selected based on its water-vapor transmission rate. In an exemplary embodiment, the plastic includes Noryl® or PEEK.

This housing may define a cavity that includes a liquid metal 214. In some embodiments, the liquid metal has a melting temperature below room temperature. Moreover, the liquid metal may have a bulk thermal conductivity between 7 and 100 W/mK.

A wide variety of liquid metals may be used in heat-transfer mechanism 200. For example, the liquid metal 214 may include a metal alloy, such as gallium-indium-tin. More generally, the liquid metal 214 includes: bismuth, lead, zinc, silver, gold, tin, chromium, nickel, aluminum, palladium, platinum, tantalum, gallium, indium, titanium, and/or an alloy of two or more of these chemicals. However, note that the liquid metal may include: elements other than metals (e.g., diamond or graphite), as well as a variety of organic and/or inorganic compounds.

While not shown in FIG. 2A, in some embodiments an inner surface of the housing may be coated with a layer that facilitates wetting with the liquid metal 214. For example, the layer may include a metal, such as gold, platinum, tantalum, titanium, tin, chromium, nickel, zinc, silver, aluminum, and/or an alloy of two or more of these chemicals.

As noted previously, the heat-transfer mechanism 200 may be configured to allow rotation of either or both of the heatpipes 110 with respect to the heatpipe coupler 112-4. For example, either or both of the end seals 212 may be configured to allow either or both of the heatpipes 110 to rotate about optional rotational axes 216. (Note that the heatpipes may have the same or different axes of rotation, i.e., the optional rotational axes 216 may or may not be coaxial.) Alternatively, the end seals 212 may be rigidly coupled to either or both of the corresponding heatpipes 110.

In an exemplary embodiment, a given end seal, such as end seal 212-1, includes two metal plates separated by a silicone-based grease, such as Krytox®, thereby providing a rotational degree of freedom to the corresponding heatpipe that is thermally and mechanically coupled to the given end seal.

Separately and/or additionally from embodiments that implement one or more rotational degrees of freedom via the end seals 212, in some embodiments the housing includes an additional seal. This is illustrated in FIG. 2B, which presents a block diagram illustrating a heat-transfer mechanism 230. In particular, this housing includes seal 240 which divides the cavity into two compartments that each include a portion of the liquid metal 214. Moreover, this seal may be configured to allow rotation of the two compartments of the housing with respect to each other, thereby facilitating rotation of either or both of the heatpipes 110. Once again, optional axes of rotation 216 of the heatpipes 110 may be the same or may be different, i.e., the optional rotational axes 216 may or may not be coaxial.

Figure 2C:
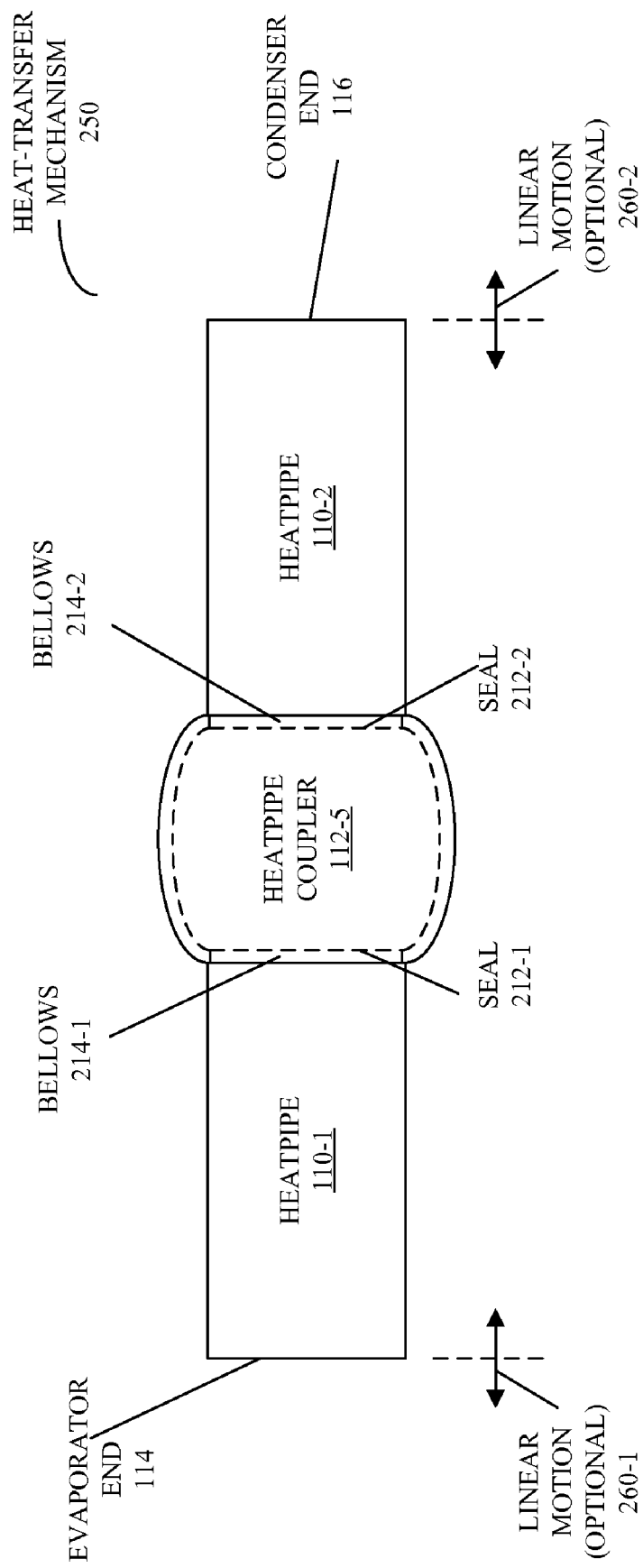
FIG. 2C Is a block diagram illustrating a heat-transfer mechanism in accordance with an embodiment of the present invention.

In some embodiments, the heat-transfer mechanism is configured to allow linear motion of either or both of the heatpipes. This is illustrated in FIG. 2C, which presents a block diagram illustrating a heat-transfer mechanism 250. For example, heatpipe coupler 112-5 may include bellows 214-1 and 214-2 in either or both of the end seals, thereby facilitating optional linear motion 260 of the corresponding heatpipes 110 with respect to the remainder of the heat-transfer mechanism 250.

Note that, in general, the heat-transfer mechanism may be configured to provide an arbitrary combination of linear motion and/or rotation for one or more mechanical degrees of freedom, as well as efficient heat transfer from one or more evaporators to one or more condensers. This latter feature may be implemented by using multiple heatpipes in a fan-in and/or a fan-out configuration. A fan-in configuration is illustrated in FIG. 3A, which presents a block diagram illustrating a heat-transfer mechanism 300, and a fan-out configuration is illustrated in FIG. 3B, which presents a block diagram illustrating a heat-transfer mechanism 350.

Figure 4:
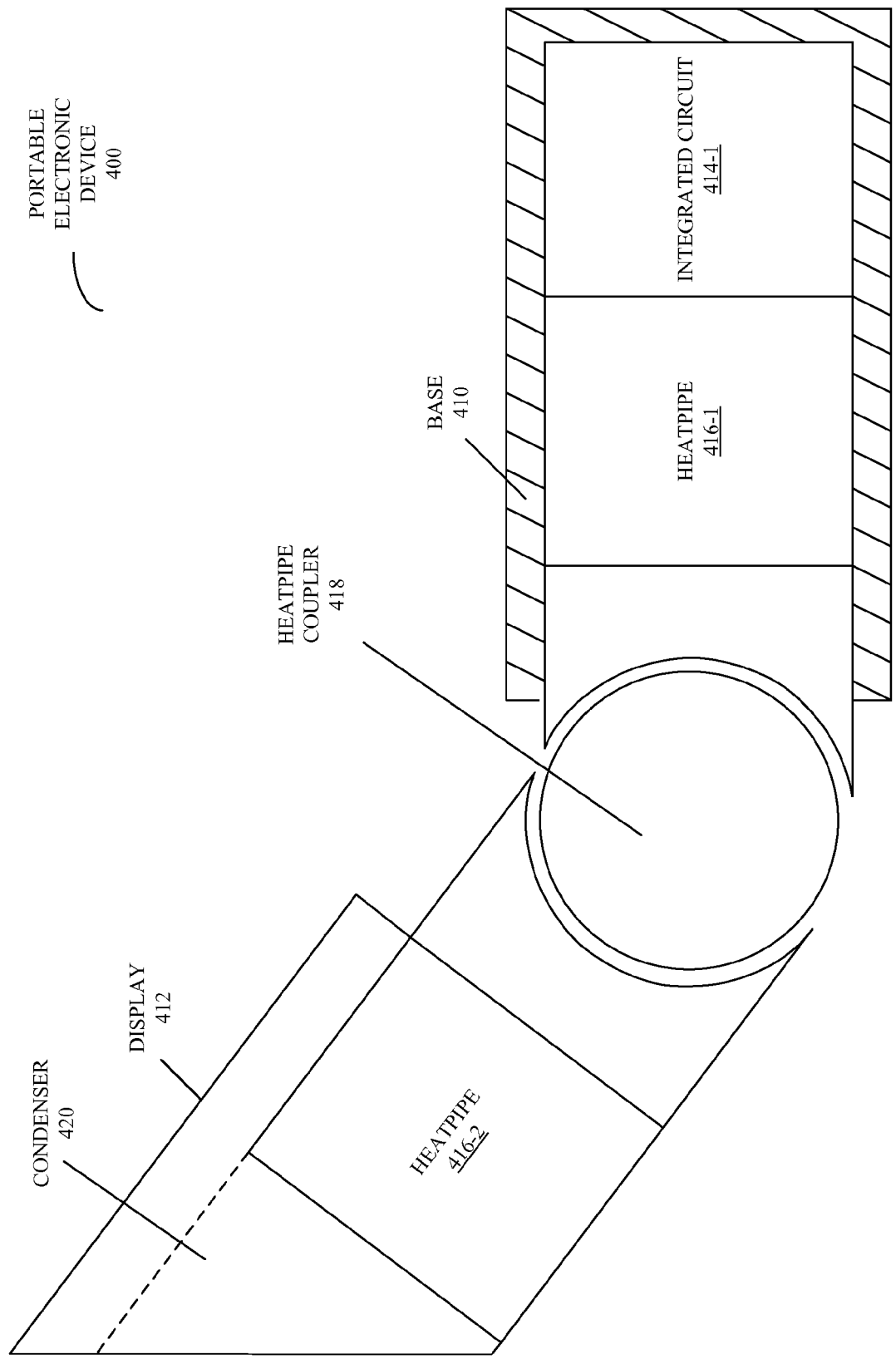
FIG. 4 is a block diagram illustrating a portable electronic device in accordance with an embodiment of the present invention.

We now describe embodiments of the portable electronic device which leverages the features provided by the heat-transfer mechanism. FIG. 4 presents a block diagram illustrating a portable electronic device 400 (such as a laptop computer). This portable electronic device includes a base 410 and a display 412, as well as one or more integrated circuits, such as integrated circuit 414-1, which generate heat during operation. Moreover, a heat exchanger, such as one of the embodiments of the heat-transfer mechanism described previously, may transfer this heat from an enclosed area in the portable electronic device 400 to an external environment. For example, heatpipes 416 may be thermally coupled by heatpipe coupler 418, which includes a liquid metal, and which allows rotation of the display 412 relative to the base 410, thereby functioning as a hinge. Heatpipe 416-2 may by coupled to condenser 420, which is included behind the display 412, and which leverages the large surface area that is available to transfer the heat to the external environment.

In some embodiments, heat-transfer mechanisms 100 (FIGS. 1A and 1B), 130 (FIG. 1C), 150 (FIG. 1D), 200 (FIG. 2A), 230 (FIG. 2B), 250 (FIG. 2C), 300 (FIG. 3A), 350 (FIG. 3B), and/or portable electronic device 400 include fewer or additional components. Moreover, two or more components may be combined into a single component and/or a position of one or more components may be changed.

We now describe embodiments of the process for transporting heat. FIG. 5 presents a flowchart illustrating a process 500 for transporting heat from an evaporator to a condenser. During the method, heat is transported from the evaporator at a first end of a first heatpipe to a second end of the first heatpipe (510). Next, the heat is thermally coupled from the second end of the first heatpipe to a third end of a second heatpipe via a heatpipe coupler which includes a liquid metal (512). Then, the heat is transported from the third end of the second heatpipe to the condenser at a fourth end of the second heatpipe (514).

In some embodiments, there may be additional or fewer operations. Moreover, the order of the operations may be changed and/or two or more operations may be combined into a single operation.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A heat-transfer mechanism, comprising:
a first heatpipe having a first end and a second end;
a second heatpipe having a third end and a fourth end; and
a heatpipe coupler thermally coupled to the second end of the first heatpipe and the third end of the second heatpipe, wherein the heatpipe coupler includes:
a housing surrounding a cavity, wherein the housing includes a body and end seals, wherein one of the end seals is rigidly coupled to the first heatpipe and another of the end seals is rigidly coupled to the second heatpipe
a liquid metal contained within the cavity, thereby providing a thermal path from the first end of the first heatpipe, which is configured to couple to a condenser, to the fourth end of the second heatpipe, which is configured to couple to an evaporator;
wherein said housing further comprises an additional seal that divides the cavity into two compartments that each include a portion of the liquid metal, and wherein said seal is configured to allow rotation of the two compartments of the housing with respect to each other.

2. The heat-transfer mechanism of claim 1, wherein a given heatpipe, which can be the first heatpipe or the second heatpipe, has a cross-sectional diameter less than 8 mm; and
wherein an end-to-end length of the heat-transfer mechanism is greater than 225 mm.

3. The heat-transfer mechanism of claim 1, further comprising an additional heat-transfer mechanism, which includes two heatpipes thermally coupled, end-to-end, by another heatpipe coupler, that is thermally coupled, in series, to the heat-transfer mechanism.

4. The heat-transfer mechanism of claim 3, wherein the additional heat-transfer mechanism is thermally coupled to the heat-transfer mechanism by an additional heatpipe coupler.

5. The heat-transfer mechanism of claim 1, wherein the given end seal is configured to allow rotation of the first heatpipe or the second heatpipe with respect to the heatpipe coupler.

6. The heat-transfer mechanism of claim 5, wherein the first heatpipe has a different axis of rotation than that of the second heatpipe.

7. The heat-transfer mechanism of claim 1, wherein axes of rotation of the two compartments are different.

8. The heat-transfer mechanism of claim 1, wherein the first heatpipe includes a bend.

9. The heat-transfer mechanism of claim 8, wherein the second heatpipe includes a bend.

10. The heat-transfer mechanism of claim 1, wherein a direction of a symmetry axis of the first heatpipe is different than that of the second heatpipe.

11. The heat-transfer mechanism of claim 1, further comprising multiple heatpipes coupled to the heatpipe coupler and which are each configured to couple to the condenser.

12. The heat-transfer mechanism of claim 1, further comprising multiple heatpipes coupled to the heatpipe coupler and which are each configured to couple to additional evaporators.

13. The heat-transfer mechanism of claim 1, wherein the heatpipe coupler is configured to allow linear motion of the first heatpipe or the second heatpipe with respect to the remainder of the heat-transfer mechanism.

14. The heat-transfer mechanism of claim 1, wherein the housing includes a metal or plastic.

15. The heat-transfer mechanism of claim 14, wherein the metal includes gold, nickel, or titanium.

16. The heat-transfer mechanism of claim 1, wherein the liquid metal includes a metal alloy.

17. The heat-transfer mechanism of claim 16, wherein the metal alloy includes gallium-indium-tin.

18. A method for transporting heat from an evaporator to a condenser, comprising:
transporting heat from the evaporator at a first end of a first heatpipe to a second end of the first heatpipe;
thermally coupling the heat from the second end of the first heatpipe to a third end of a second heatpipe via a heatpipe coupler, wherein the heatpipe coupler includes a housing surrounding a cavity that contains a liquid metal for thermally coupling the heat from the second end of the first heatpipe to a third end of a second heatpipe, wherein the housing includes a body and end seals, wherein one of the end seals is rigidly coupled to the first heatpipe and another of the end seals is rigidly coupled to the second heatpipe and an additional seal that divides the cavity into two compartments that each include a portion of the liquid metal, and wherein said seal is configured to allow rotation of the two compartments of the housing with respect to each other; and
transporting heat from the third end of the second heatpipe to the condenser at a fourth end of the second heatpipe.

19. A portable electronic device, comprising:
an integrated circuit;
a heat-transfer mechanism; and
a condenser, wherein the heat-transfer mechanism includes:
a first heatpipe having a first end, which is thermally coupled to the condenser, and a second end;
a second heatpipe having a third end and a fourth end, which is thermally coupled to the integrated circuit; and
a heatpipe coupler thermally coupled to the second end of the first heatpipe and the third end of the second heatpipe, wherein the heatpipe coupler contains:
a housing surrounding a cavity, wherein the housing includes a body and end seals, wherein one of the end seals is rigidly coupled to the first heatpipe and another of the end seals is rigidly coupled to the second heatpipe
a liquid metal contained within the cavity, thereby providing a thermal path from the condenser to the evaporator;
wherein said housing further comprises an additional seal that divides the cavity into two compartments that each include a portion of the liquid metal, and wherein said seal is configured to allow rotation of the two compartments of the housing with respect to each other.

* * * * *

UNITED STATES PATENT AND TRADEMARK OFFICE
CERTIFICATE OF CORRECTION

PATENT NO. : 7,701,716 B2  Page 1 of 1
APPLICATION NO. : 12/141295
DATED : April 20, 2010
INVENTOR(S) : Richard Lidio Blanco, Jr. et al.

It is certified that error appears in the above-identified patent and that said Letters Patent is hereby corrected as shown below:

In column 7, line 23, in Claim 1, delete "heatpipe" and insert --heatpipe; --, therefor.

In column 8, line 55, in Claim 19, delete "heatpipe" and insert --heatpipe; --, therefor.

Signed and Sealed this
First Day of November, 2011

David J. Kappos
*Director of the United States Patent and Trademark Office*